RADIO FREQUENCY AMPLIFIER AND CONVERTER

Filed Jan. 24, 1957 3 Sheets-Sheet 1

INVENTOR.
THOMAS B. HORGAN.
BY Alden D. Redfield
Irwin P. Garfinkle
ATTORNEYS.

July 7, 1959 T. B. HORGAN 2,894,126

RADIO FREQUENCY AMPLIFIER AND CONVERTER

Filed Jan. 24, 1957 3 Sheets-Sheet 2

INVENTOR.
THOMAS B. HORGAN,
BY Alden D. Redfield
Irwin P. Garfinkle
ATTORNEYS.

July 7, 1959 T. B. HORGAN 2,894,126

RADIO FREQUENCY AMPLIFIER AND CONVERTER

Filed Jan. 24, 1957 3 Sheets-Sheet 3

INVENTOR.
THOMAS B. HORGAN
BY Alden D. Redfield
Irwin P. Garfinkle
ATTORNEYS.

2,894,126

RADIO FREQUENCY AMPLIFIER AND CONVERTER

Thomas B. Horgan, Cincinnati, Ohio, assignor to Avco Manufacturing Corporation, Cincinnati, Ohio, a corporation of Delaware Application January 24, 1957, Serial No. 636,037

6 Claims. (Cl. 250—20)

This system relates generally to a radio frequency amplifier and detector circuit as used in a superheterodyne receiver and, more particularly, to a high frequency amplifier and converter consisting of two intercoupled transistors.

In the well-known superheterodyne type of receiver, the principle of heterodyning is used to convert the carrier frequency of the received radio signal to a predetermined intermediate frequency which may then be detected. To accomplish the frequency conversion, the incoming carrier frequency signal is mixed (or heterodyned) with the signal from a local oscillator, thereby producing a wave which will have components of each of the frequencies and the sum and difference thereof. By appropriate resonant circuits tuned usually to the difference frequency, an intermediate frequency is produced which may then be amplified and detected for audio frequency signals. If the radio frequency circuits and the local oscillator circuits are simultaneously and appropriately varied, all received radio frequencies may be converted to a predetermined intermediate frequency and the remainder of the receiver circuit may be fixed.

This invention is concerned with a transistorized superheterodyne receiver in which a self-excited converter is used, i.e., a type of converter in which the local oscillator and mixer functions are combined in one operation. Moreover, this invention employs a stage of radio frequency amplification before the conversion is effected in order that there be greater isolation of the antenna circuit from the oscillator signal and for the purpose of providing additional gain and selectivity. The radio frequency stage also provides a means of applying automatic gain control and a proper impedance match between a high impedance antenna and a low impedance converter.

It is one of the objects of this invention to provide a reliable, high gain frequency conversion system which is economical both in active and passive elements, and which produces stable operation with wide tolerance transistors and non-critical passive elements.

It is another object of the invention to provide a self-excited converter which comprises a stable transistor oscillator into which a radio frequency is injected without degrading operation of the oscillator, and from which the resultant intermediate frequency may be conveniently taken.

Another object of the invention is to provide a self-excited, low impedance converter supplied with radio frequency signals from a radio frequency stage which provides the required impedance match between the converter and a high impedance antenna, and which provides an additional stage of amplification.

Still another object of this invention is to convert a stable transistor oscillator to self-excited converter use, and to provide a transistorized stage of radio frequency amplification before the conversion is effected.

The converter stage employed in this invention consists of a transistorized stable oscillator into which the received radio frequency signals are injected. The oscillator is of the type disclosed in application, Serial No. 624,877, filed on November 28, 1956, by Emery J. H. Bussard, and assigned to the assignee of this invention. Because of the low impedance of this circuit, a low impedance drive is required, and a radio frequency amplifier, in addition to providing R.F. gain, also provides the requisite impedance match between the high impedance antenna and the low impedance converter stage.

A more complete understanding of the objects and of the organization and operation of the several embodiments of the invention may be had by a study of the following detailed description and by reference to the accompanying drawings, in which.

Figure 4:
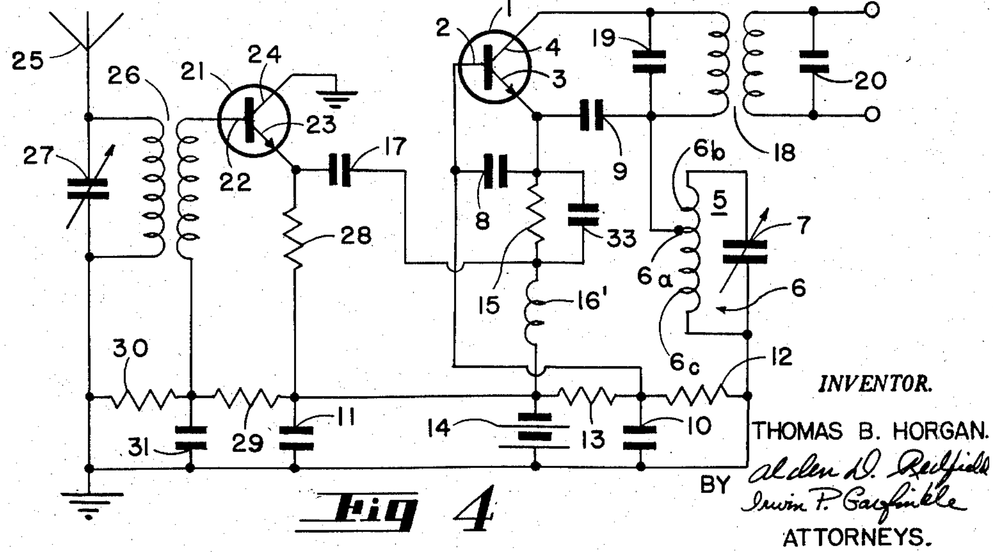
Fig. 4 is another preferred embodiment of my invention.
Figure 7:
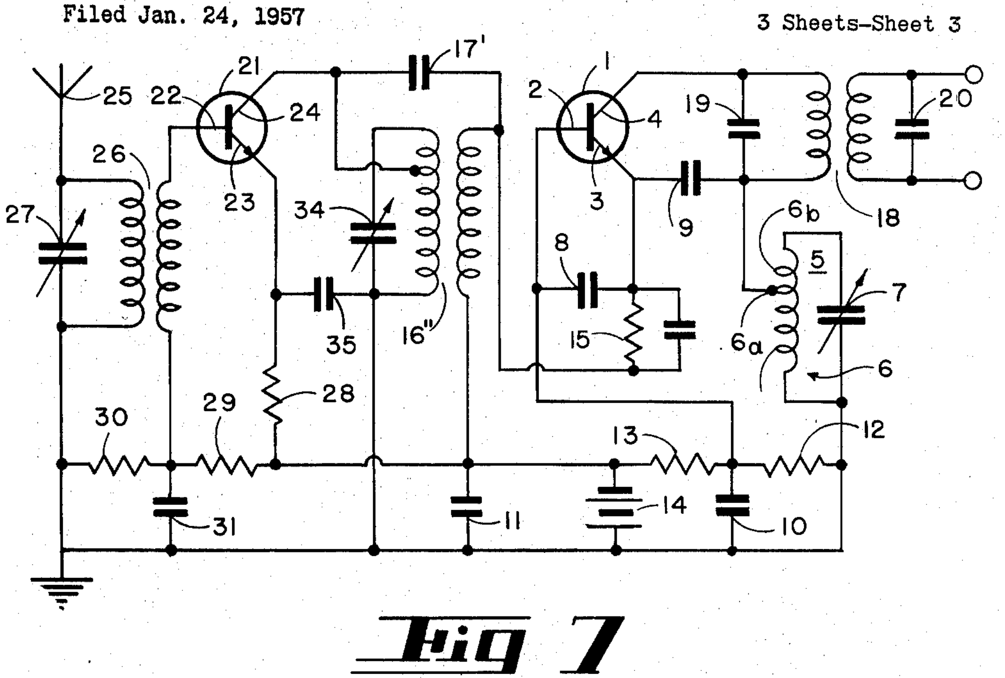
Figure 8:
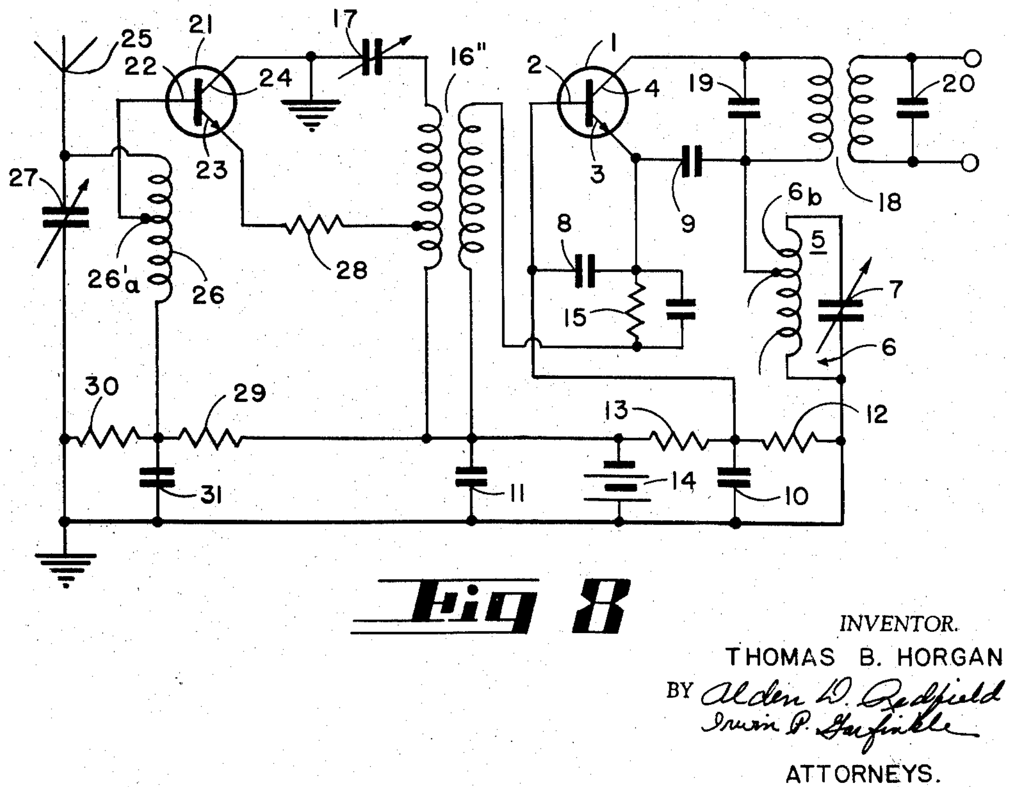

Fig. 7 is a modification of the form of my invention shown in Fig. 4, in which the radio frequency stage is inductively coupled to the converter and in which the radio frequency transistor is connected for common emitter operation; and Fig. 8 is a modification of the form of my invention shown in Fig. 4, in which the radio frequency stage is inductively coupled to the converter and in which the radio frequency stage transistor is connected for common collector operation.

Figure 1:
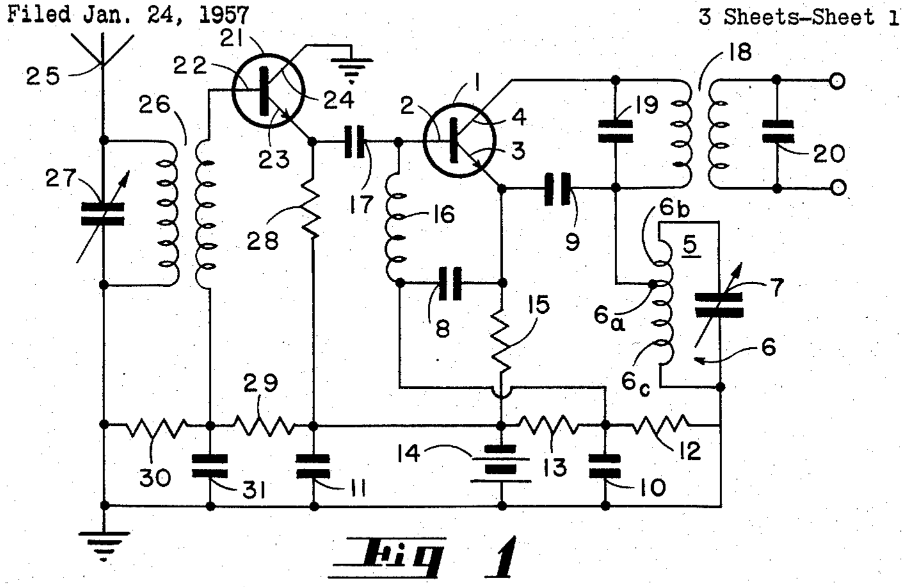
Fig. 1 is a preferred embodiment of my invention.

Reference should now be made to the preferred embodiment of Fig. 1 and particularly to the self-excited converter stage which shall be discussed first. As previously stated, a self-excited converter is essentially an oscillator into which radio frequency signals are injected and mixed with the oscillator signals, and from which a fixed intermediate frequency signal is derived. As is well-known in the transistor art, a principal problem in the use of transistors in such circuits is the inherent instability of the transistor. The self-excited converter of this invention is fully stable under adverse conditions of temperature, humidity, varying bias and other operating conditions.

The converter stage employs an NPN junction type transistor 1 connected for grounded emitter operation and comprising a base 2, an emitter 3 and a collector 4. The oscillator circuit for transistor 1 includes tuned network 5 comprising an autotransformer 6, tapped at *6a* and having winding sections *6b* and *6c* and a variable condenser 7. A capacitive voltage divider formed of condensers 8 and 9 is connected across the tuned network 5. (The D.C. blocking condensers 10 and 11 are large and present essentially a short circuit to alternating currents.) The circuit is biased by means of resistors 12 and 13 which are connected across a battery 14 or other suitable source of potential. For providing added stability to the system, an emitter-resistor 15 is connected in circuit with the battery 14 and the emitter 3 to provide a negative feedback path. In this form of the invention, radio frequency is coupled into the system by means of an untuned inductor 16 in the base circuit of the transistor 1, and by means of a coupling capacitor 17 from the radio frequency stage. The radio frequency mixes with the frequency produced in the resonant system, including the network 5 and the condensers 8 and 9. The output from the system is taken from the collector circuit by means of a transformer 18 tuned to the difference frequency by means of condensers 19 and 20.

As previously stated, the converter of this invention is an oscillator circuit provided with a radio frequency input circuit and an intermediate frequency output circuit. If we consider the operation of the converter minus the inductor 16 and minus the resonant transformer circuit 18, the remaining circuit elements comprise a dominant positive feedback oscillator which will provide oscillations at a frequency determined by the setting of the variable condenser 7. The oscillator output could be derived from the inductor 6 by inductive coupling or any other suitable means.

As in unusual dominant positive feedback oscillators, it is necessary that a portion of the transistor output be fed back to the input circuit in a sense cumulative to the input signal. For this purpose, the capacitive voltage divider, consisting of condensers 8 and 9 selected in accordance with the known Barkhausen criteria are connected, respectively, in the input circuit between the emitter 3 and the base 2, and in the output circuit between the emitter 3 and the collector 4. The network 5 is a high Q circuit connected across the capacitive divider, and because of the tap at **6*a* it comprises both a series resonant circuit composed of inductor 6*b* and condenser 7, and a low impedance inductive shunt 6*c*. The shunt 6*c* comprises only a small portion of the autotransformer 6 and, therefore, extremely large currents are induced from the section 6*b* to the section 6*c* when voltage is applied, and these currents are fed back to the transistor for positive starting. With the biasing arrangement used, a very high bias is initially applied to the base, and if the starting currents were permitted to continue, the transistor would burn out very quickly. The emitter-resistor 15 provides the necessary negative feedback to reduce the current and to stabilize the system. Additional stabilization is achieved, since, at resonance, the circuit 5 presents a resistive impedance which constitutes a shunt-type negative feedback path. Since this impedance changes at either side of resonance, the shunt feedback current will automatically compensate for frequency drift. Moreover, the use of the tapped autotransformer 6** produces very low impedances between each of the transistor terminals and thus minimizes the effects of transistor internal parameter variations.

The received radio frequency signals are injected into the converter through the inductor 16 in the base-emitter circuit. The inductor 16 is a low inductive impedance and is connected in series with the emitter-base feedback condenser 8. It is noted that the inductor 16 is also in series with the collector-base oscillator circuit return lead. Since the transistor 1 is already oscillating at the resonant frequency of the network 5 and condensers 8 and 9, mixing of the two frequencies occurs and, as a result, the output signal at the collector 4 will contain components of the radio frequency, the local oscillator frequency, and the sum and difference frequencies. The desired intermediate frequency may then be selected by the parallel-tuned transformer 18 in the collector circuit. The L.C. ratio of this transformer is made low to assure low impedance to the frequencies of the local oscillator and the harmonics.

Due to the fact that the low impedance shunt **6*c* is connected across the collector-to-base terminals, the impedance encountered in the transistor 1 is very low and, therefore, a low impedance drive is required. On the other hand, the antenna system requires a high impedance, and the high impedance antenna must be matched with the converter. Turning now to the radio frequency stage, including the emitter-follower-transistor 21** of Fig. 1, it may be seen that a system producing the desired results has been illustrated in the preferred embodiment of the invention.

The transistor 21 is an NPN, junction type transistor having base 22, an emitter 23 and a collector 24. The transistor 21 is connected for common collector operation, i.e., the collector is grounded and is common to the input circuit between the base 22 and the collector 24, and to the output circuit between the emitter 23 and the collector 24. Radio frequency signals are applied for amplification to the transistor 21 from the antenna 25 to the base-collector input circuit through the transformer 26 which is tuned by the variable condenser 27. Emitter follower output is taken from across the emitter-resistor 28 and coupled by means of the condenser 17 to the base-emitter circuit of transistor 1 through the inductor 16. The radio frequency stage is biased by means of the resistors 29 and 30 connected across the battery 14, while the D.C. blocking condensers 11 and 31 provide an alternating current path to ground.

The arrangement of the transistor 21 provides the required impedance match between the high impedance antenna and the low impedance transistor 1. The impedance matching function results from the fact that a transistor connected in an emitter-follower configuration transforms impedance by a ratio of "beta," i.e., the A.C. ratio of emitter current to base current. In practice, the input to the transistor 1 of the converter may be about 100 ohms; with a transistor 21 having a beta of 50, the input impedance of the transistor will be 2,500 ohms. The untuned secondary winding of transformer 26 may then be wound to match the high impedance of the antenna which may be 50,000 to 100,000 ohms.

In addition to providing the desired impedance match between the high impedance antenna and the converter, I have also achieved some power gain. With the emitter-follower configuration, the power gain will equal 10 log beta db. Moreover, the alpha, i.e., the ratio of collector current to emitter current of an emitter-follower transistor is less than one (about .95) and, therefore, the voltage gain is less than one. Accordingly, oscillations are inherently avoided, and special neutralizing circuits are not required for stabilization. AGC power may be applied either to the base 22 or the emitter 23 of the transistor 21, although control at the base is preferred because the power requirement at the base is only 1/beta times the power required at the emitter.

Figure 2:
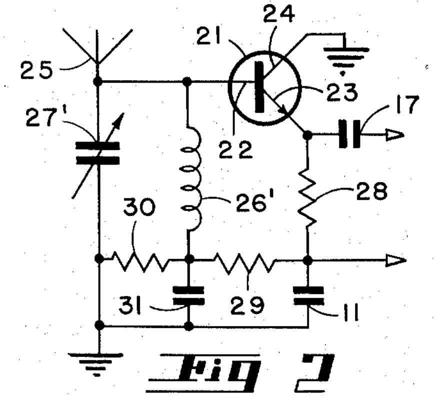
Fig. 2 is a modification of my invention in which the radio frequency stage is directly coupled to the antenna.
Figure 3:
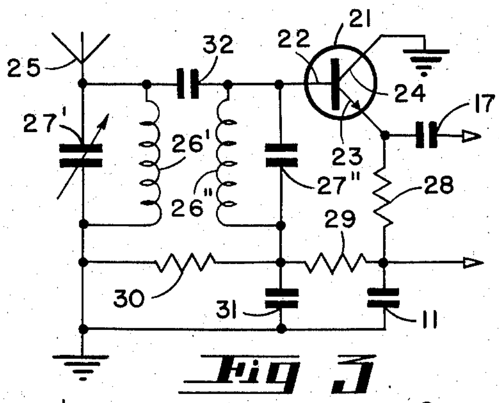
Fig. 3 is a modification in which the coupling between the radio frequency amplifier and antenna is double-tuned.

Fig. 2 is a modification of the R.F. amplifier shown in Fig. 1. In this case, however, the emitter-follower transistor 21 is coupled directly to the antenna 25, which is tuned by means of the resonant tank circuit comprising the antenna coil 26′ and the variable condenser 27′. In Fig. 3, the transistor 21 is coupled through a condenser 32 to a double-tuned circuit comprising the antenna coil 26′ tuned by variable condenser 27′ and an inductance coil 26″ tuned by variable condenser 27″. The impedance match in each of these cases is accomplished by the use of a high beta transistor 21.

Fig. 4 is similar to Fig. 1, with the exception that the inductor 16′ has been substituted for the inductor 16 and has been inserted in circuit with the emitter 3 of transistor 1. In addition, a by-pass condenser 33 has been coupled across the emitter-resistor 15 to short circuit the resistor for radio frequencies. Thus, radio frequency signals are injected from the transistor 21 into the converter across the inductor 16′ and, in manner similar to that described for Fig. 1, the oscillator voltage is mixed with the radio frequency signals to produce an intermediate frequency output at the transformer 18. The coupling and impedance-matching problems between the R.F. stage and the converter stage are solved in this embodiment in the same manner as was done in Fig. 1.

Figure 5:
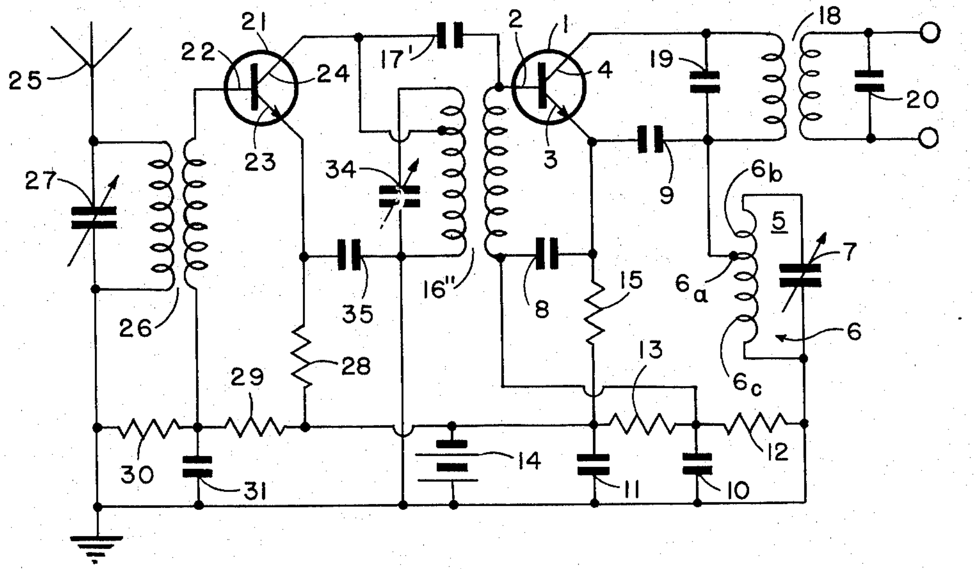
Fig. 5 is a modification of the form of my invention shown in Fig. 1, in which the radio frequency stage is inductively coupled to the converter and in which the radio frequency stage transistor is connected for common emitter operation.
Figure 6:
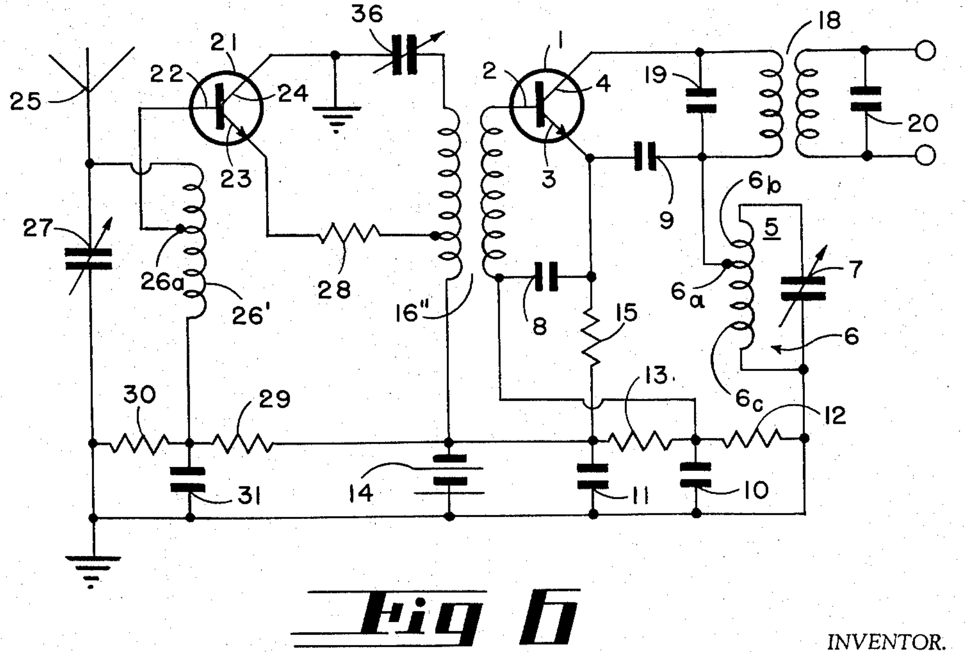
Fig. 6 is a modification of the form of my invention shown in Fig. 1, in which the radio frequency stage is inductively coupled to the converter and in which the radio frequency stage transistor is connected for common collector operation.

The embodiments of Figs. 5 and 6 employ converters which are identical with that shown in Fig. 1, i.e., the R.F. signal is injected into the circuit of transistor 1 between the base 2 and the condenser 8, but modified R.F.

coupling stages are illustrated. In Fig. 5 the R.F. output from transistor 21 is capacitively coupled through condenser 17' and inductively coupled through the primary and secondary windings of transformer 16'' to the base 2 of transistor 1. The transformer 16'' is tuned by means of a variable condenser 34 which, in practice, is ganged with variable condensers 7 and 27 in the oscillator and antenna circuits, respectively. The condenser 35, connected between the emitter 23 and the primary of transformer 16'', blocks D.C. signals from the R.F. output. The combination of capacitive and inductive coupling used in this embodiment provides high and uniform gain over a wide frequency band and obtains R.F. selectivity for rejection of unwanted off-channel signals and attenuation to oscillator radiation through the high impedance antenna.

In Fig. 6 the transistor 21 is connected for grounded collector operation. R.F. output is derived from the collector 24 and applied to the base input circuit of transistor 1 through the transformer 16''. The transformer 16'' is tuned by a variable condenser 36 which, in practice, may be ganged with tuning condensers 7 and 27 for the oscillator and antenna coils, respectively. The signals from antenna 25 are coupled into the base circuit of transistor 21 through the base 22 which is connected to the tap **26*a*' of the antenna coil 26'**. For R.F. stages of the grounded collector type shown in Fig. 6, high and uniform gain, R.F. selectivity, and attenuation to oscillator radiation are obtained by inductive coupling only.

The embodiments illustrated in Figs. 7 and 8 employ R.F. stages which are identical with those illustrated in Figs. 5 and 6, respectively. The converter stage used is identical with that shown in Fig. 2. The cooperation between stages is the same as that described in connection with those embodiments.

In each of Figs. 1 to 8 it was desirable for stable transistor oscillator performance that the input impedance of transistor 1 be very low. This meant that the converter input impedance was low and, therefore, special consideration was required for the drive and coupling device. The coupling devices illustrated in Figs. 1 to 8 comprise power or current transformers which are capable of efficiently driving the very low impedance of the converter and, hence, constitute a very useful arrangement for the radio frequency stage of a transistorized receiver in which a self-excited converter is employed.

In the preferred form of the invention illustrated in Figs. 1 to 4, additional circuit simplicity and economy of parts is achieved by the use of aperiodic coupling between the radio frequency stage and the converter stage. This type of coupling requires ganged tuning between the tuning condensers only in the radio frequency and local oscillator circuits, and does not require the usual third gang for the condenser in the coupling circuit.

What I now claim as my invention is:

1. In a superheterodyne receiver, the combination comprising: a high impedance antenna; an untuned radio frequency stage comprising a transistor having a high impedance input circuit and a low impedance output circuit; a self-excited, low impedance, high power converter for converting a radio frequency signal to an intermedaite frequency signal comprising a transistor having a base electrode, an emitter electrode and a collector electrode, a capacitive voltage divider connected between said collector and base electrodes, said capacitive voltage divider comprising a first condenser connected between said base and said emitter electrodes, and a second condenser connected between said emitter and said collector electrodes, and a network resonant at a predetermined frequency which is the difference between said radio frequency and said intermediate frequency, said network being connected across said capacitive voltage divider and comprising a series resonant circuit and an inductive shunt having a low impedance at said predetermined frequency, biasing means for the electrodes of said transistor for inducing current oscillations at said predetermined frequency in said resonant network; and low impedance aperiodic circuit means for coupling said low impedance output circuit of said radio frequency stage to said converter for injecting a radio frequency signal into said transistor to mix with said current oscillations.

2. The invention as defined in claim 1 wherein said means for coupling said radio frequency stage to said converter comprises an aperiodic low impedance inductor connected in series with said first condenser between said base electrode and said emitter electrode, said inductor being coupled across said low impedance output circuit of said radio frequency stage.

3. The invention as defined in claim 1 wherein said means for coupling said radio frequency stage to said converter comprises an untuned inductor connected in series with the emitter of said transistor and connected across said low impedance output circuit of said radio frequency stage.

4. The combination comprising: a high impedance tuned antenna for receiving radio frequency signals; an untuned radio frequency amplifier comprising a first transistor having a first base coupled to said tuned antenna, a first collector connected to ground, and a first emitter connected to ground through a load resistor; a converter for converting said radio frequency signals to intermediate frequency signals, said converter comprising a second transistor having a second base electrode, a second emitter electrode and a second collector electrode, a capacitive voltage divider connected between said collector and base electrodes, said capacitive voltage divider comprising a first condenser connected from said second collector electrode to said second emitter electrode, and a second condenser connected between said second emitter electrode and said second base electrode; a resonant tank tuned to a predetermined frequency which is the difference between said radio frequency and said intermediate frequency, said tank being connected across said second collector and base electrodes; an inductive shunt having a low impedance at said predetermined frequency, said inductor being coupled across said resonant tank, biasing means for inducing current oscillations in said resonant tank at said difference frequency; and aperiodic means for coupling said load resistor to said converter whereby said radio frequency signal and said current oscillations are mixed to produce said intermediate frequency signals.

5. The invention as defined in claim 4 wherein said aperiodic means comprises an untuned, series-connected condenser and inductor connected across said load resistor, the junction of said series-connected condenser and inductor being connected to said second base.

6. The invention as defined in claim 4 wherein said aperiodic means comprises an untuned, series-connected condenser and inductor connected across said load resistor, the junction of said condenser and inductor being connected to said second emitter.

References Cited in the file of this patent

UNITED STATES PATENTS

| | | |
|---|---|---|
| 2,647,957 | Mallinckrodt | Aug. 4, 1953 |
| 2,760,070 | Keonjian | Aug. 21, 1956 |
| 2,794,909 | Berg | June 4, 1957 |

OTHER REFERENCES

Book "Principles of Transistor Circuits," by Shea, Wiley, only page 69 cited.

Article "Transistor Broadcast Receivers," by Stern and Raper, in Electrical Engineering, December 1954, only page 1109 cited.